(12) United States Patent
Chan et al.

(10) Patent No.: US 6,480,989 B2
(45) Date of Patent: *Nov. 12, 2002

(54) INTEGRATED CIRCUIT DESIGN INCORPORATING A POWER MESH

(75) Inventors: Chun Chan, San Jose, CA (US); Tammy Huang, Fremont, CA (US); Mike Liang, Milpitas, CA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/106,890

(22) Filed: Jun. 29, 1998

(65) Prior Publication Data

US 2001/0049813 A1 Dec. 6, 2001

(51) Int. Cl.[7] ............................. G06F 17/50; G06F 9/45; H01L 27/10
(52) U.S. Cl. ............................. 716/8; 257/211; 716/11; 716/14
(58) Field of Search ........................ 438/29, 128, 598, 438/599; 257/211; 716/8

(56) References Cited

U.S. PATENT DOCUMENTS

| | | | | |
|---|---|---|---|---|
| 4,673,966 A | * | 6/1987 | Shimoyama ............... | 357/68 |
| 5,119,169 A | * | 6/1992 | Kozono et al. ............ | 357/68 |
| 5,391,900 A | * | 2/1995 | Onodera et al. .......... | 257/207 |
| 5,598,348 A | * | 1/1997 | Rusu et al. ............... | 364/491 |
| 5,914,873 A | * | 6/1999 | Blish, II .................... | 363/147 |
| 6,028,440 A | * | 2/2000 | Roethig et al. ............ | 324/765 |
| 6,057,169 A | * | 5/2000 | Singh et al. ............... | 438/14 |
| 6,115,279 A | * | 9/2000 | Kitsukawa et al. ......... | 365/63 |
| 6,202,196 B1 | * | 3/2001 | Huang et al. ............... | 716/14 |

OTHER PUBLICATIONS

T. Mitsuhashi et al., Power and Ground Network Topology Optimization for Cell VLSIs, 1992 Proceedings ACM/IEEE Design Automation Conference, pp. 524–529, Jun. 1992.*

T. Yoshitome, Hierarchical Analyzer for VLSI Power Supply Networks based on a New Reduction Method, 1991 IEEE International Conference on Computer–Aided Design, pp. 298–301, Nov. 1991.*

* cited by examiner

Primary Examiner—Matthew Smith
Assistant Examiner—A. M. Thompson
(74) Attorney, Agent, or Firm—Mitchell, Silberberg & Knupp, LLP

(57) ABSTRACT

Provided is a technique for designing an integrated circuit die which includes a semiconductor layer, a primary metal layer, a horizontal metal layer and a vertical metal layer. Electronic components are laid out on the semiconductor layer, and a primary power distribution network for distributing power to the electronic components is laid out on the primary metal layer. Then, a uniform trunk width is calculated for all trunks in a power mesh based on a desired maximum voltage drop for the generated electronic component layout. Finally, horizontal power trunks are laid out on the horizontal metal layer and vertical power trunks are laid out on the vertical metal layer using the calculated uniform trunk width, so as to form the power mesh, and an electrical connection is specified between the power mesh and the primary power distribution network.

18 Claims, 7 Drawing Sheets

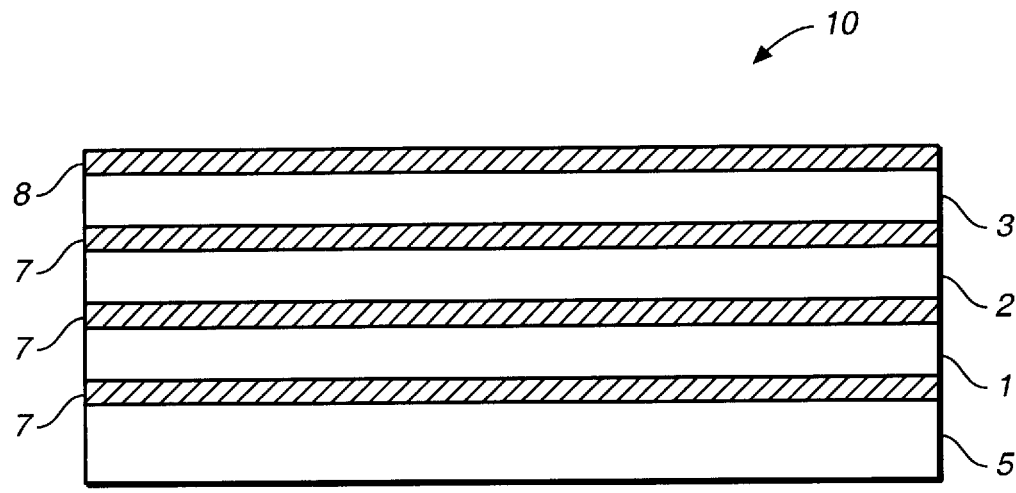
FIG._1 *(PRIOR ART)*
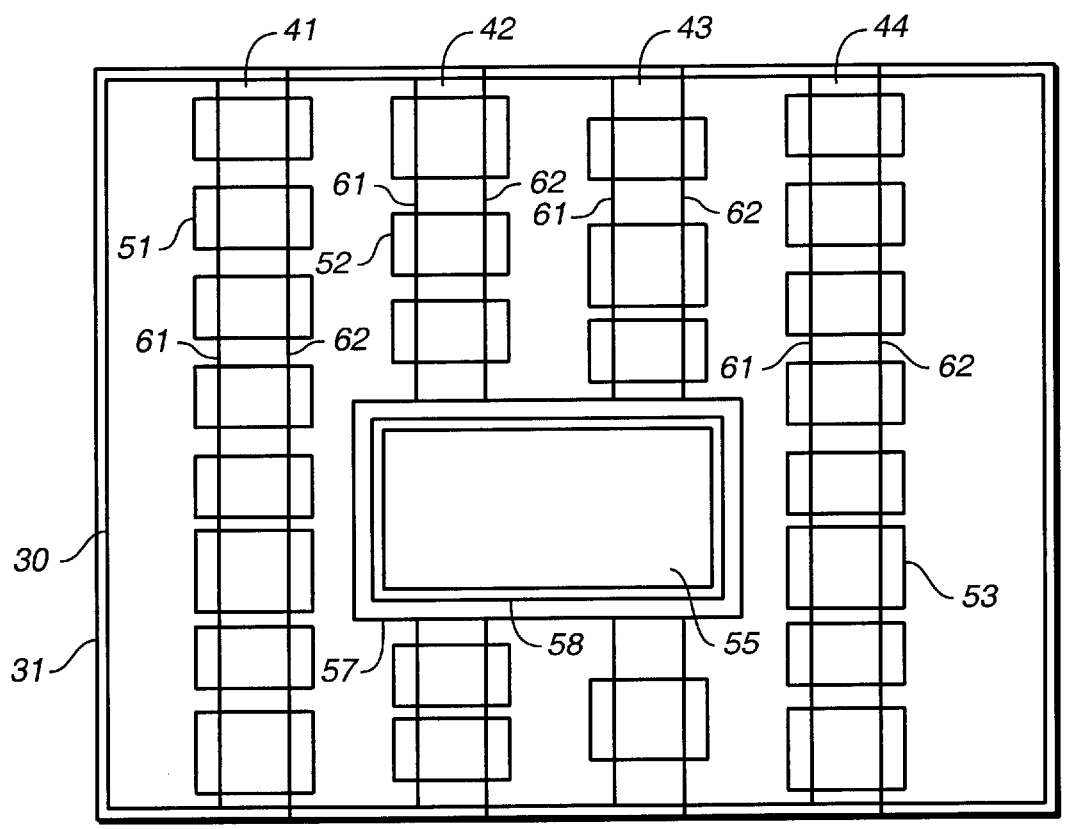
FIG._3 *(PRIOR ART)*

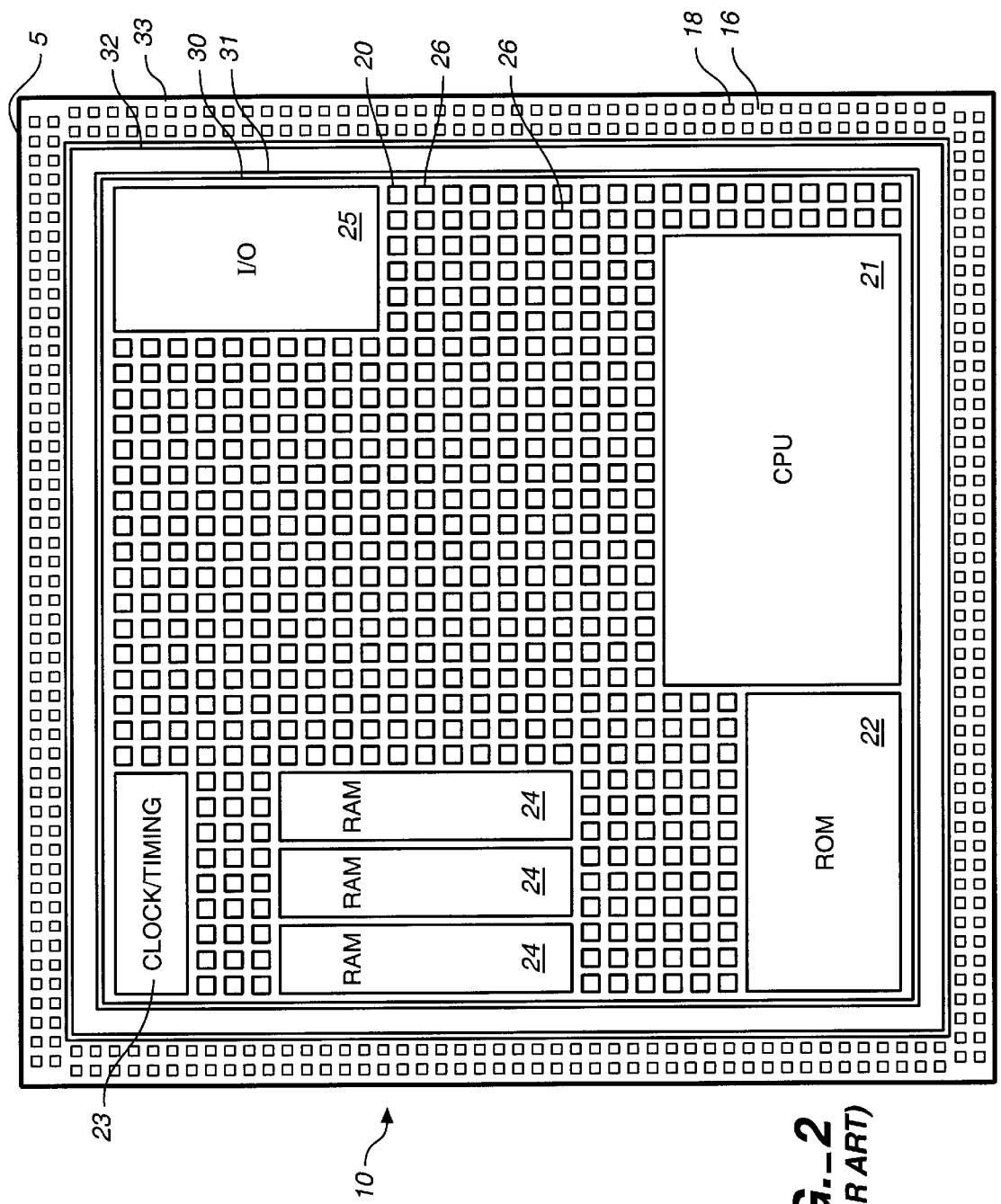
FIG._2 (PRIOR ART)

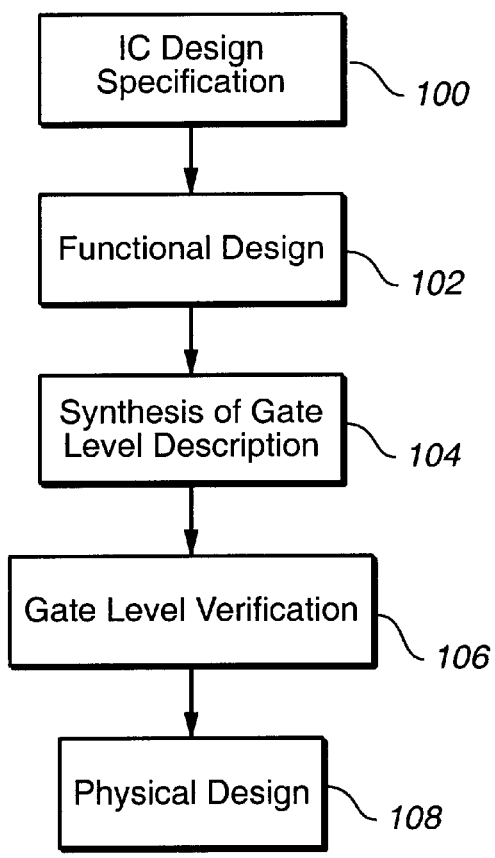
FIG._4
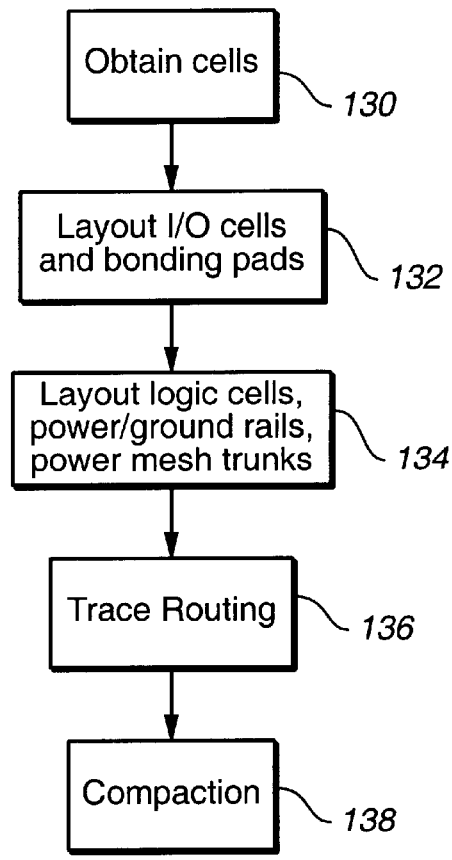
FIG._5

160

Power Panel

◇ 161 # of horiz. trunks ▭ 162     # of vert. trunks ▭ 163
165 ◇ Horiz. trunk pitch ▭ 166   Vert. trunk pitch ▭ 167

Total current of the design  ▭ 171
Wire bond resistance         ▭ 172
# of pad pairs per side      ▭ 173
Horizontal layer code        ▭ 174
Vetical layer code           ▭ 175 specify one of the following:

◇ Trunk width — 181                    ▭ 182
◇ Voltage drop at the center — 185     ▭ 186

[ Get Default ]   [ SetValues ]   [ Create Mesh ] 190

*FIG._6*

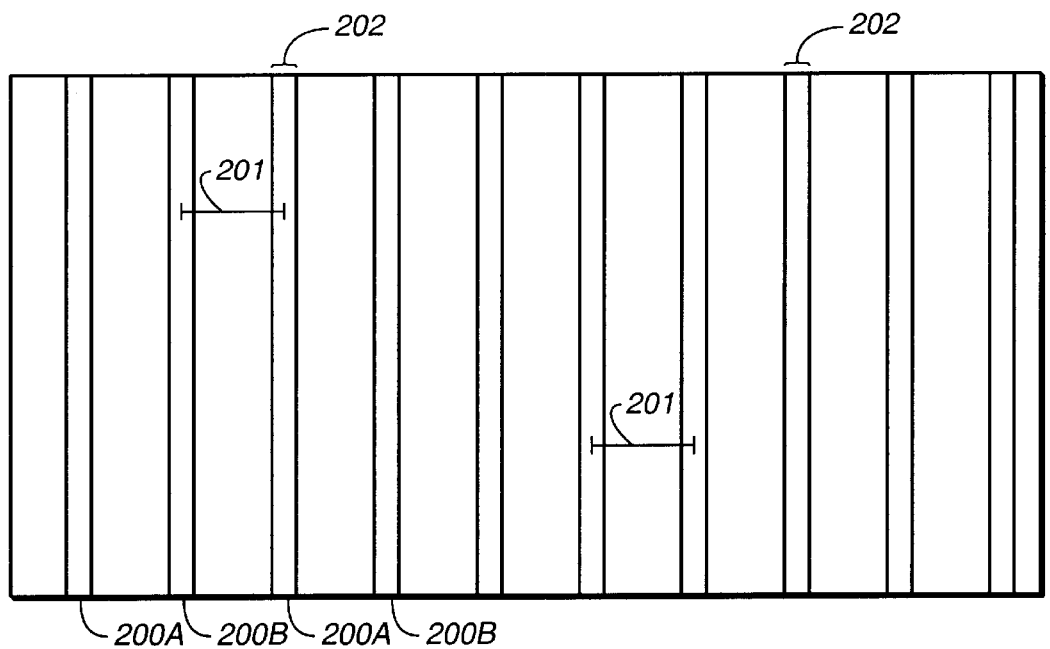
FIG._7A
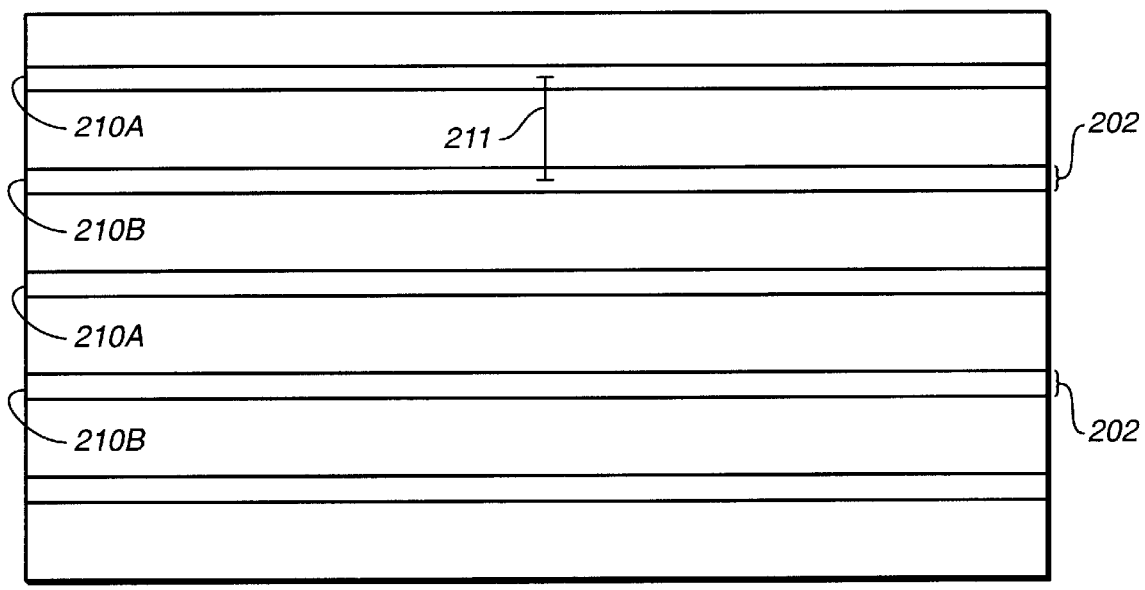
FIG._7B

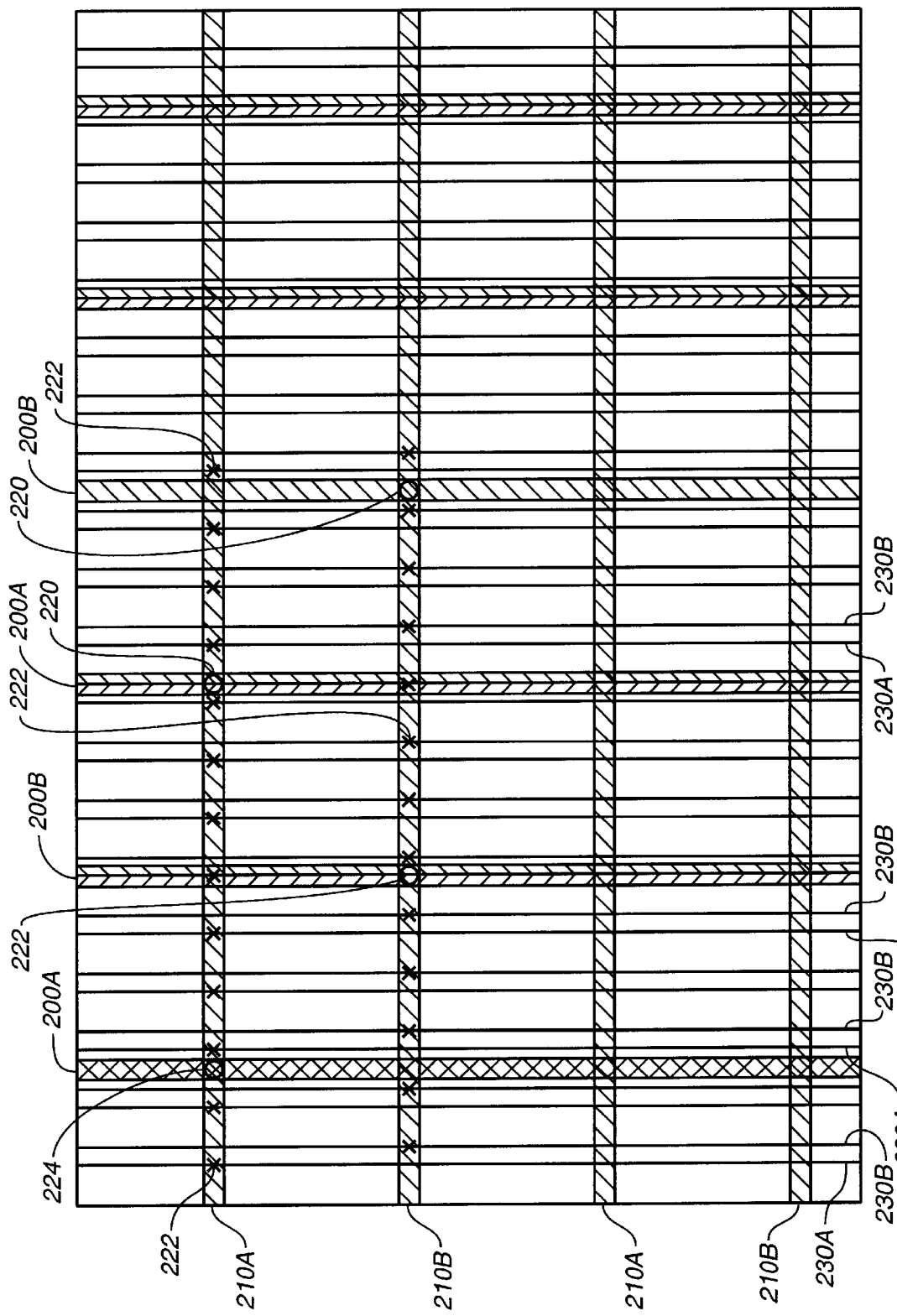
FIG._8

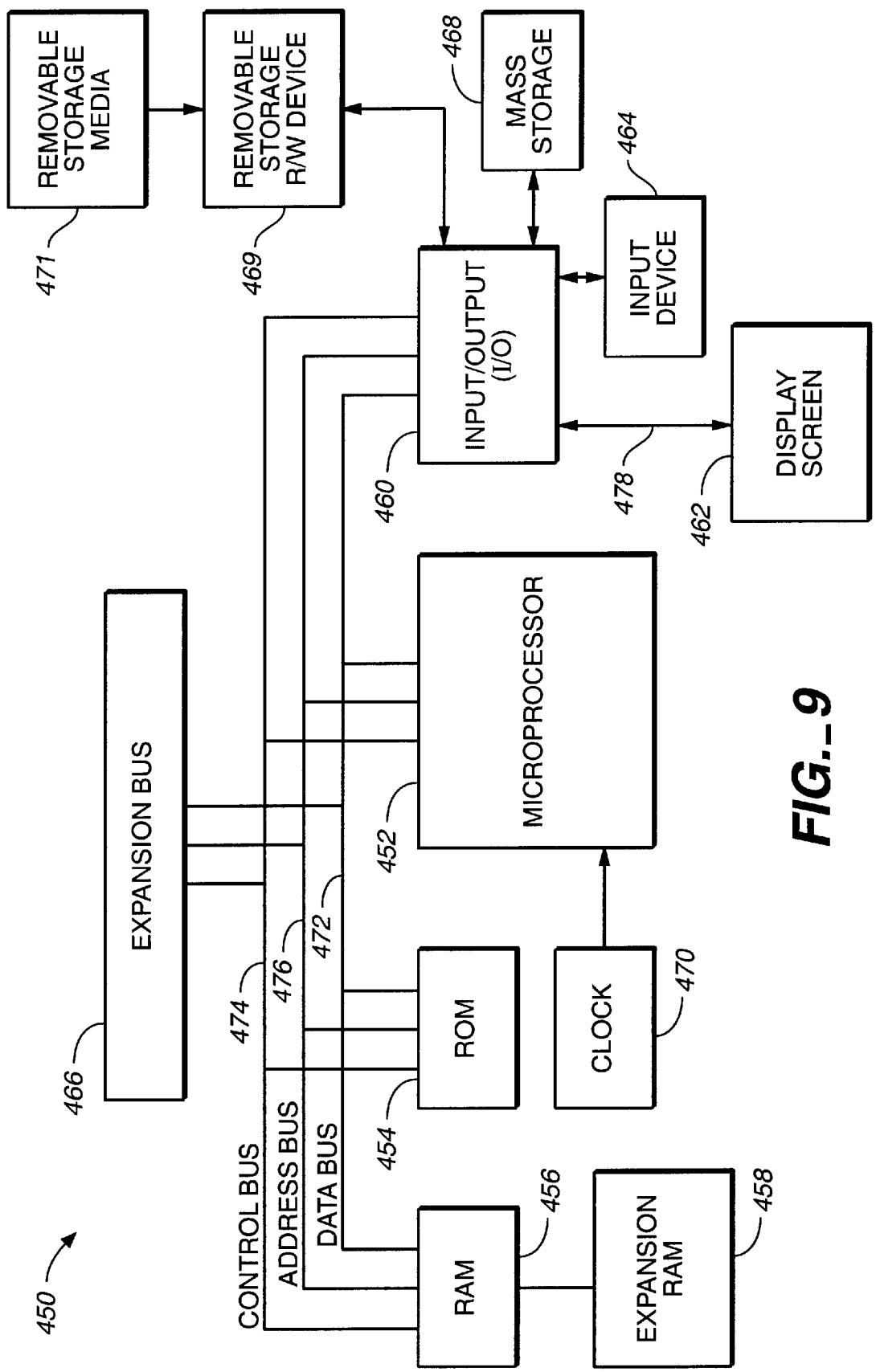
FIG._9

INTEGRATED CIRCUIT DESIGN INCORPORATING A POWER MESH

BACKGROUND OF THE INVENTION

1. Field of the Invention

The present invention concerns integrated circuits (ICs) and IC design, and particularly relates to the use of a power mesh in an integrated circuit.

2. Description of the Related Art

FIG. 1 provides a simplified cross-sectional view of an integrated circuit chip (or die) 10, which includes a semiconductor layer 5, three metal layers 1 to 3, electrically insulating layers 7, and passivation layer 8. Semiconductor layer 5, which is typically polysilicon, is used for forming the transistors and other electronic devices and may also be used for routing some of the electrical connections between these devices. However, wire routing occupies space on the semiconductor layer 5 which otherwise could be used for the electronic devices. As a result, ordinarily only the shorter electrical connections are formed on semiconductor layer 5. For the remainder of the connections, metal layers 1 to 3 are provided.

Metal layers 1 to 3 may be formed from any of a variety of materials including aluminum, copper or an electrically conductive alloy. Typically, two to four metal layers are formed on top of semiconductor layer 5. To simplify the routing process, routing typically is performed using mainly horizontal and vertical trace (or wire) segments. Moreover, to permit such routing to be performed in an orderly manner, each metal layer typically is designated as either a horizontal metal layer or a vertical metal layer. Horizontal metal layers are used primarily for horizontal wire segments and vertical metal layers are used primarily for vertical wire segments. By routing wires in the metal layers 1 to 3, electrical connections can be made without using valuable space on semiconductor layer 5. Between metal layers 1 and 2, between metal layers 2 and 3, and between metal layer 1 and semiconductor layer 5 is an electrically insulating layer 7, which typically is formed as an oxide film. Connections between any of metal layers 1 to 3 and semiconductor layer 5 are made using interlayer holes called vias. Passivation layer 8 functions to prevent the deterioration of the electrical properties of the die caused by water, ions and other external contaminants, and typically is made of a scratch-resistant material such as silicon nitride and/or silicon dioxide.

FIG. 2 provides a representational illustration of the layout of integrated circuit die 10. The logic circuitry of integrated circuit 10 is formed on the interior portion 20 of the semiconductor layer 5. The logic portion 20 includes a number of functional circuit blocks that can have different sizes and shapes. The larger blocks can include, for example, central processing units such as CPU 21, read-only memories such as ROM 22, clock/timing units such as clock/timing unit 23, random access memories such as RAMs 24, and input/output (I/O) units such as I/O unit 25 for providing an interface between CPU 21 and peripheral devices. These blocks, commonly known as megacells, can be considered as modules for use in various circuit designs, and are represented as standard designs in circuit libraries. The logic portion 20 further includes tens of thousands, hundreds of thousands or even millions of additional small cells 26. Each cell 26 represents a single logic element, such as a gate, or several logic elements interconnected in a standardized manner to perform a specific function. Cells that consist of two or more interconnected gates or logic elements are also available as standard modules in circuit libraries. As used herein, the term "cells" refers generically to megacells, such as elements 21 to 25, as well as small cells 26. It is also noted that the "logic portion" 20 does not necessarily consist solely of logic processing circuitry, but may include circuits such as phase-locked loops containing both digital and analog portions, as well as circuits which perform purely analog processing.

Along the periphery of the semiconductor layer 5 are I/O buffer cells 16. Each of the I/O buffer cells 16 is either a power signal buffer, a ground signal buffer or an information signal buffer. As used herein, the term "information signal" is defined to mean a signal that conveys any type of information and includes, for example, clock, data, address and control signals. In a wire-bond IC chip, each such buffer cell 16 generally has connected to it at least one metal bonding pad 18 which is used as an electrical connection for an I/O signal. Thus, bonding pads 18 provide the electrical connections between the die and the package containing the die. Typically, pins on the package then connect the IC to other electronic components on a printed circuit board.

Certain of pads 18 are connected to external power and ground. Each such pad is connected to a buffer cell 16, which in turn is connected to one of the chip's power or ground rings, as the case may be. More specifically, power ring 32 and ground ring 33 supply power (VDD) and ground (VSS) to the buffer cells 16. Similarly, power ring 30 and ground ring 31 provide power (VDD2) and ground (VSS2) to the internal logic circuitry 20. In order to isolate the internal logic power and ground from the I/O buffer power and ground, ordinarily certain pad/buffer pairs are connected only to the internal logic power/ground rings 32 and 33, and different pad/buffer pairs are connected only to the buffer power/ground rings. Power and ground rings 30 to 33 ordinarily are implemented on the metal layers, such as metal layers 1 and 2.

FIG. 3 illustrates one conventional technique for routing power and ground from rings 30 and 31, respectively, to electronic components in the interior logic portion 20 of the IC die 10. In FIG. 3, cells are arranged in cell columns 41 to 44. Each cell generally has a standard width but can have different lengths. Examples of such standard-width cells include cells 51 to 53. To supply power and ground to the cells in this configuration, parallel vertical power rails 61 and ground rails 62 are used. Specifically, each cell column is provided with a power rail 61 and a ground rail 62. Typically, power rails 61 and ground rails 62 are implemented on a vertical metal layer, such as metal layer 1. Power rails 61 and ground rails 62 then connect to the standard-width cells using vias from metal layer 1 to semiconductor layer 5 at the required connection points. As shown in FIG. 3, power rails 61 run the entire length of interior logic portion 20 from the top side of power ring 30 to the bottom side of power ring 30. Similarly, ground rails 62 run the entire length of interior logic portion 20 from the top side to the bottom side of ground ring 31. Also as shown in FIG. 3, the foregoing configuration may also include cells having non-standard widths, such as cell 55. In this case, external power ring 57 and external ground ring 58 supply power and ground to cell 55 and also serve to jog the power rails 61 and ground rails 62 around the non-standard cell 55.

In the foregoing conventional arrangement, the power rails 61 and ground rails 62 typically are designed to be wide enough to carry the amount of current required by their respective cell columns. However, in addition to insuring adequate current-carrying capacity, another concern is voltage drop. For example, while the voltage at the power/ ground ring might be approximately 2.5 V, voltage typically drops closer toward the center of the die and may be insufficient to adequately power the cells near the center. However, because a pair of power/ground rails must be provided for each cell column, simply widening the rails enough to prevent excessive voltage drop often may be impractical.

SUMMARY OF THE INVENTION

The present invention addresses the foregoing problems by providing an integrated circuit which uses a power mesh.

According to one aspect, the invention is an integrated circuit (IC) die which includes a semiconductor layer, electronic components formed on the semiconductor layer, and a primary metal layer upon which is formed a primary power distribution network for distributing power to the electronic components. The IC die also includes a horizontal metal layer, a vertical metal layer, and a power mesh electrically connected to the primary power distribution network, the power mesh including horizontal power trunks formed on the horizontal metal layer and vertical power trunks formed on the vertical metal layer.

According to a further aspect, the invention is an integrated circuit (IC) die which includes a semiconductor layer, electronic components formed on the semiconductor layer, a primary metal layer upon which are formed vertical power and vertical ground rails, a horizontal metal layer, and a vertical metal layer. The IC die also includes a power mesh electrically connected to the primary power distribution network, the power mesh including horizontal power trunks formed on the horizontal metal layer and vertical power trunks formed on the vertical metal layer. According to this aspect of the invention, the horizontal power trunks and the vertical power trunks have a larger cross-section than the power rails, and spacing between the vertical power trunks is significantly greater than spacing between the power rails.

By including a power mesh in an integrated circuit die according to the foregoing arrangements, the present invention often can facilitate achieving a desired worst-case voltage drop in an efficient manner.

In a more particularized aspect of the invention, the horizontal power trunks are electrically connected to the vertical power trunks at overlap points using vias. This feature of the invention often can increase the proportion of total distance a power or ground signal travels on the power mesh, thereby further reducing voltage drop. In another particularized aspect of the invention, the horizontal power trunks are equally spaced, and the vertical power trunks are equally spaced. As a result, unused resources on the metal layer can be distributed evenly across the die. In a further particularized aspect, all of the horizontal power trunks have the same width, and all of the vertical power trunks have the same width. This aspect of the invention often can provide good results in designs where more or less uniform current distribution is expected.

In another particularized aspect of the invention, the power mesh electrically connects to the electronic components only through the primary power distribution network. By virtue of this feature of the invention, the power mesh can be designed independently of the electronic component positions.

According to a still further aspect, the invention is directed to design of an integrated circuit die which includes a semiconductor layer, a primary metal layer, a horizontal metal layer and a vertical metal layer. Electronic components are laid out on the semiconductor layer. A primary power distribution network, for distributing power to the electronic components, is laid out on the primary metal layer. Horizontal power trunks are laid out on the horizontal metal layer and vertical power trunks are laid out on the vertical metal layer, so as to form a power mesh. An electrical connection is then specified between the power mesh and the primary power distribution network.

The foregoing arrangement can provide a structured system, for use in designing an integrated circuit, to address the problem of voltage drop. According to more particularized aspects of the invention, the power mesh can be designed with a view toward insuring that a worst case voltage drop to any electronic component on the semiconductor layer is not larger than a specified maximum; alternatively, the power mesh can be designed using a fixed trunk width, a fixed number of vertical trunks and a fixed number of horizontal trunks, and a worst case voltage drop is determined.

The invention also addresses problems in the prior art by including a coarse power distribution network, as well as a fine power distribution network.

Thus, in a further aspect the invention is directed to an integrated circuit (IC) die which includes a semiconductor layer, electronic components formed on the semiconductor layer. A fine power distribution network, formed on a first metal layer, distributes power to the electronic components. A coarse power distribution network, formed on at least one metal layer which is different from the first metal layer, coarsely distributes power across the IC die to discrete points on the fine power distribution network.

Utilizing the fine power distribution network, the present invention can distribute power as required to the electronic components on the semiconductor layer. In addition, the coarse power distribution network can be used for managing voltage drop in an efficient manner.

The foregoing summary is intended merely to provide a brief description of the general nature of the invention. A more complete understanding of the invention can be obtained by referring to the claims and the following detailed description of the preferred embodiments in connection with the accompanying figures.

BRIEF DESCRIPTION OF THE DRAWINGS

FIG. 1 provides a cross-sectional view of an integrated circuit die.

FIG. 2 illustrates one example of layout in an integrated circuit die.

FIG. 3 illustrates a technique for routing power and ground to interior logic cells of an integrated circuit die.

FIG. 4 is a flow diagram illustrating integrated circuit design according to a representative embodiment of the invention.

FIG. 5 is a flow diagram for explaining physical design according to a representative embodiment of the invention.

FIG. 6 illustrates a pop-up window for creating a power mesh according to the preferred embodiment of the invention.

FIGS. 7A and 7B illustrate the vertical and horizontal trunks of a power mesh according to the preferred embodiment of the invention.

FIG. 8 illustrates power/ground rails overlaid by a power mesh according to the preferred embodiment of the invention.

FIG. 9 is a block diagram of a general purpose computer system, representing one suitable computer platform for implementing the methods of the invention.

DETAILED DESCRIPTION OF THE PREFERRED EMBODIMENTS

FIG. 4 illustrates a flow diagram for providing a brief overview of IC chip design according to a representative embodiment of the invention. Briefly, according to FIG. 4, an IC design specification is prepared; a functional description of a system corresponding to the design specification is produced; a gate-level circuit description is synthesized from the functional description; a simulation is performed to verify the feasibility of the gate-level description; and physical design is performed.

In more detail, in step 100 an IC design specification is prepared. At this initial step of the design cycle, the desired system design is described in the highest level of abstraction. Subsequent steps in the design cycle provide successively more detail until all information required to fabricate the chip has been derived. Preferably, the design specification dictates features such as performance criteria, required external interfaces and protocols, and product cost targets.

In step 102, a functional design is produced. The functional design describes a system that will satisfy the IC design specification prepared in step 100. Preferably, the functional design is written using a highly structured syntax so as to permit subsequent steps in the design cycle to be performed using automated computer-aided design tools. More preferably, the functional design is written in a hardware description language (HDL) such as VHDL (IEEE standard 1076-1993) or Verilog-HDL.

In step 104, a description of a gate-level circuit is synthesized based on the HDL code produced in step 102. Preferably, gate-level design is performed by running an automated synthesis tool on the HDL code. Upon execution of the synthesis tool, physically realizable gates and flip-flops are selected from a pre-defined library and are interconnected in a manner so as to satisfy the relationships and to perform the processing defined by the HDL code. Processing by the synthesis tool preferably utilizes pre-defined user design constraints which have been formulated in an effort to enhance the feasibility of the design, particularly with respect to problems which might otherwise not be discovered until later in the design cycle. The format of the gate-level circuit description synthesized in step 104 is a "netlist", which categorizes a number of "nets", each including one or more gates and/or flip-flops, and which also describes the interconnections between these nets.

In gate-level verification step 106, a computer simulation is run to test the circuit design synthesized during gate-level design step 104. The goals of this simulation are to determine whether all performance criteria have been met and whether any timing or other circuit errors will occur in response to a variety of different input signals and conditions. Upon completion of gate-level verification in step 106, the netlist is provided to physical design step 108, and a dump of top-level signals in the netlist is provided to the user.

In physical design step 108, the netlist generated in step 106 is mapped to information for physically implementing the corresponding circuit on an IC die. The objective of physical design is to determine an optimal arrangement of devices in a plane or in a three-dimensional space, and an efficient interconnection or routing scheme between the devices to obtain the desired functionality. One goal of physical design step 108 is to implement the design using minimum chip area. Other factors considered during physical design include thermal generation, power/ground noise, electromagnetic effects, worst-case voltage drop and the number of metal layers available for wire routing.

Step 108 produces a set of design files in an unambiguous representation known as an intermediate form that describes the layout. The design files are then converted into pattern generator files that are used to produce patterns called masks by an optical or electron beam pattern generator. A representative embodiment of physical design step 108 is discussed in more detail below in connection with FIG. 5.

It should be noted that while one example of a particular design cycle is described above, variations of the foregoing may also be used, as will be apparent to those skilled in the art. In addition, although the foregoing design process is described above and shown in FIG. 4 as being purely sequential, many times one or more of the steps will need to be repeated. That is, if the design is found to be unfeasible at one step, an earlier step might need to be re-executed in order to correct the problem. For example, it might occur that in step 104 a gate-level description can not be generated to satisfy the functional design requirements using the available technology library, while at the same time maintaining the user's design constraints. In this case, the functional description may need to be redesigned in step 102 in order to achieve a feasible design.

Physical Design.

A more detailed discussion of physical design step 108 (shown in FIG. 4) in the preferred embodiment of the invention will now be discussed with reference to the flow diagram shown in FIG. 5. Briefly, according to FIG. 5, cells are obtained based on the supplied netlist; I/O cells and associated bonding pads are laid out around the periphery of the die; interior logic cells, power/ground rails and mesh trunks are laid out; traces are routed between the cells; and compaction is performed.

In more detail, in step 130 cell descriptions are obtained from a cell library based on the netlist input from step 106. Specifically, logic and other signal processing cells, as well as I/O buffer cells, are obtained corresponding to the circuits identified in the netlist.

In step 132 the I/O buffer cells and associated bonding pads are laid out (or placed) around the periphery of the die. As used herein, layout or placement refers to generating layout or placement information. During device fabrication, electronic devices and wires are formed on the IC die using the placement information generated during physical design.

In step 134, the logic cells are placed at the interior of the die. A main concern in performing this placement is to reduce spacing between cells, thereby minimizing the amount of wire routing that will need to be performed. The main sub-steps in performing step 134 are partitioning, floorplanning and layout.

The logic portion of a chip may contain several million transistors. As a result, layout of the entire chip generally cannot be handled due to the limitations of available memory space and computation power. Therefore, the logic circuitry normally is partitioned by grouping circuit components into blocks, such as subcircuits and modules. The actual partitioning process considers many factors such as the size of the blocks, number of blocks and number of interconnections between the blocks.

The output of partitioning is a set of blocks, together with the interconnections required between these blocks. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

Floor planning and placement are concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement typically is done in two phases. In the first phase, an initial placement is created. In the second phase, the initial placement is evaluated and iterative improvements are made until the layout has minimum area and conforms to design specifications.

Also during step 134, a fine power distribution network and a coarse power distribution network are laid out on the die's metal layers. In the preferred embodiment of the invention, the fine power distribution network includes a sequence of parallel vertical power and ground rails implemented on the vertical metal layer closest to the semiconductor layer. This vertical metal layer typically is the metal layer closest to the semiconductor layer, or metal layer 1. More preferably, the fine power distribution network includes alternating power and ground rails, such as shown in FIG. 3. The fine power distribution network is laid out so as to be able to supply each electronic component on the semiconductor layer with power. In the cell-column arrangement illustrated in FIG. 3, this generally requires providing a power/ground rail pair for each cell column. Generation of the coarse power distribution network is discussed in detail below.

In step 136, traces are routed from the I/O cells and interior logic cells to other I/O and interior logic cells, as well as to power and ground rings. The objective of routing is to complete all the interconnections between blocks according to the specified netlist, subject to the space available for routing. First, the space not occupied by blocks, which is called the routing space, is partitioned into rectangular regions called channels and switch boxes. The goal of a router is to complete all circuit connections using the shortest possible wire length and using only the channel and switch boxes.

Routing preferably is done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes channel routing and switch box routing.

In step 138, compaction is performed. Compaction is the process of compressing the layout in both directions such that the total area is reduced. By making the chips smaller, wire lengths are reduced, which in turn reduces the signal delay between components of the circuit. At the same time, a smaller area enables more chips to be produced on a wafer, which in turn reduces the cost of manufacturing. Compaction must ensure that no rules regarding the design and fabrication processes are violated.

While the foregoing implementation of physical design step 108 is preferable, other variations apparent to those skilled in the art may also be used. Moreover, although the steps are described above and shown in FIG. 5 as being entirely sequential, it should be understood that feasibility problems discovered in any one of the steps frequently will require repeating a prior step. For example, routing problems discovered in step 136 might require adjustments to layout by re-executing portions of step 134.

Layout of Coarse Power Distribution Network.

During the floorplanning stage of step 134 in the physical design process, a designer has the option of specifying a coarse power distribution network. Preferably, the designer uses an automated floorplanning software tool, such as LSI Logic's Planning Manager or Layout Editor. In the graphical user interface (GUI) for the floorplanning software tool is a button for creating the coarse power distribution network. In the preferred embodiment of the invention, the coarse power distribution network is formed as a power mesh and therefore the floorplanning software GUI includes a "Create Power Mesh" button. Upon selection of the "Create Power Mesh" button, a window for creating the power mesh pops up. An example of such a window is the Power Panel window 160 shown in FIG. 6.

Referring to FIG. 6, the designer first selects either radio button 161 or radio button 165. If button 161 is selected, the designer selects the desired number of horizontal trunks 162 and the desired number of vertical trunks 163. If button 165 instead is selected, the designer specifies the desired horizontal trunk pitch 166 and the desired vertical trunk pitch 167. Pitch refers to center-to-center spacing between adjacent trunks. In the preferred embodiment, adjacent trunks in the power mesh are equally spaced.

Next, the designer specifies the total core current ($I_{total}$) required by the design 171, the wire bond resistance ($R_{wb}$) for each pad 172, the number of pad pairs per side 173 (N), the horizontal layer code 174 and the vertical layer code 175. More details regarding $I_{total}$, $R_{wb}$ and N are given below. In the preferred embodiment, the IC die includes five metal layers and the horizontal layer code 174 and vertical layer code 175 are specified as the top two metal layers. More preferably, metal layer 5 (which is farthest from the semiconductor layer) is specified for the vertical metal layer and metal layer 4 (second farthest) is specified as the horizontal metal layer.

Finally, the designer may select radio button 181 and specify the desired trunk width 182 ($W_{trunk}$). In this case, upon selecting "Create Mesh" button 190 the power mesh is created using the specified information and an estimate of the worst-case voltage drop (i.e., at the center of the die) is determined, as explained below, and output by the floorplanning software tool. Alternatively, the designer may select radio button 185 and specify a desired worst-case voltage drop 186 ($V_{desdrop}$). In this latter case, upon selecting the "Create Mesh" button 190 a trunk width is calculated using the specified information and the power mesh is created using the designer-specified information, together with the determined trunk width.

In the event the designer has specified the desired trunk width, then worst case voltage drop preferably is determined as:

$$V_{totaldrop} = 2 \times \left( K_D \times \rho_{eff} \times I_{total} \times \frac{I_{total}}{4N} \times R_{wb} + \frac{1}{4} \times I_{avg} \times R_{seg} \right) \quad \text{Eq. 1}$$

In the above equation, the voltage drop across the primary power distribution network is disregarded when determining the worst case voltage drop.

On the other hand, if the designer has specified a desired worst-case voltage drop, then the trunk width preferably is determined as:

$$W_{trunk} = \frac{\rho_{unit} \times L \times K_D \times I_{total}}{T\left(\frac{1}{2}V_{desdrop} - \left(\frac{I_{total}}{4N} \times R_{wb} + \frac{1}{4} \times I_{avg} \times R_{seg}\right)\right)} \quad \text{Eq. 2}$$

where $$\rho_{eff} = \frac{\rho_{unit} \times L}{W_{trunk} \times T} \quad \text{Eq. 3}$$

Note that if the desired pitch of the mesh trunks is given instead of the number of mesh trunks per side, then $$T = int(L/P) \quad \text{Eq. 4}$$

Also in the above equations:

$$R_{seg} = \frac{\rho_{ring}}{w_{ring}}(I_{seg}) \quad \text{Eq. 5}$$

where $I_{seg} = \frac{L}{N}$; and $$I_{avg} = \frac{1}{2}\left(\frac{I_{total}}{4N} - \frac{I_{total}}{4T}\right)\left(\frac{4TN}{T^2 + 2NT}\right) \quad \text{Eq. 6}$$

if T/N is even, and $$I_{avg} = \frac{1}{2}\left(\frac{I_{total}}{4N} - \frac{I_{total}}{4T}\right)\left\{\frac{\left(\frac{T}{N} - 1\right)\left(\frac{1}{2} + \frac{1}{2}\right)}{\frac{1}{2}\left(\frac{T}{N} - 1\right)} + \sum_{k=1}^{\frac{1}{2}\left(\frac{T}{N}-1\right)} k + \frac{1}{2}\right\} \quad \text{Eq. 7}$$

if T/N is odd. If T/N is not an integer, then $I_{avg}$ should be prorated accordingly.

The variables shown in the above equations are defined as follows:

N Number of VDD2/VSS2 pad pairs per side. Typically, this value will be provided by a software layout tool such as LSI Logic's Package Planner/Quick I/O placer.

$\rho_{unit}$ Wire resistance per square (ohms/square) in the metal layers designated for the power mesh (e.g., the top two metal layers). As used in these definitions, a square refers to a square $\mu$m.

$\rho_{ring}$ Wire resistance per square (ohms/square) for the power ring (VDD2 or VSS2). The power ring layer preferably is the same as the I/O ring segment.

L Length of the power ring (VDD2 or VSS2) per side (in $\mu$m). The value can be approximated by the core length.

$w_{ring}$ Wire width (in $\mu$m) for the power ring (VDD2 or VSS2). Average of the VDD2/VSS2 circuit wire widths in the I/O cells.

$K_D$ This is an empirical constant and is set to 0.076.

$I_{total}$ Total core current consumption (in A). If this information is not available, use $I_{total} = C_{freq} \times I_{gate} \times N_{gate} \times F_{switch}$ where $C_{freq}$ is the clock frequency, $I_{gate}$ is the current per gate per MHz, $N_{gate}$ is the total gate count. If the total gate count is not available, then an estimate of the number of cell gates can be found by summing up the heights of all cells in the design and dividing the sum by the gate height. $F_{switch}$ is the gate switching factor.

T Number of VDD trunks per side. Note that T=floor (L/P) through truncation.

P VDD trunk pitch per side ($\mu$m). Note that P=int(L/T).

$W_{trunk}$ Width of the VDD trunk (in $\mu$m).

$V_{desdrop}$ Desired voltage drop (in V) for the given design (including drops on both VDD and VSS)

$R_{wb}$ Wirebond resistance (in ohms). This value varies depending on the package. If this value is not available, for worst-case analysis, use 0.9 ohm.

When deriving the foregoing equations, the following assumptions were made: (1) the mesh is square and has an equal number of trunks in each direction (i.e., horizontal and vertical); (2) the power distribution resistance is the same in the x and y directions; (3) the power distribution is accomplished through a plane with peripheral current feeds; (4) current sink within the die is uniform; (5) power pads are evenly distributed along the periphery of the die; and (6) current is uniformly distributed along the wire bonds.

Thus, the floorplanning tool can obtain trunk width and trunk pitch for the power mesh, either directly from the designer or by using the above equations in connection with the other information supplied by the designer. Using these values, the floorplanning tool lays out the power mesh as shown in FIGS. 7A and 7B. FIG. 7A shows a vertical metal layer upon which are formed alternating vertical VDD2 trunks 200A and vertical VSS2 trunks 200B. As noted above, in the preferred embodiment vertical trunk pitch 201 and trunk width 202 are constant. Similarly, FIG. 7B depicts a horizontal metal layer upon which are formed alternating VDD2 horizontal trunks 210A and horizontal VSS2 trunks 210B, each having a horizontal trunk pitch 211 and a trunk width 202. In the preferred embodiment, trunk pitch 201 is equal to trunk pitch 211. Although not shown in FIGS. 7A and 7B, vertical trunks 200 and horizontal trunks 210 preferably extend across the entire core logic portion of the die from one side of the VDD2/VSS2 rings to the other, and each trunk is preferably connected at each end to the respective VDD2 or VSS2 ring.

FIG. 8 illustrates both the power mesh layout and the power/ground rail layout of the present embodiment of the invention. As noted above, the vertical trunk metal layer preferably is the top metal layer, the horizontal trunk metal layer preferably is the metal layer that is second from the top, and the power/ground rails preferably are laid out on the metal layer closest to the semiconductor layer. In the preferred embodiment, in which five metal layers are used, the power/ground rails are on metal layer 1, the horizontal trunks are on metal layer 4, and the vertical trunks are on metal layer 5.

Preferably, the vertical and horizontal trunks of the same type (i.e., VDD2 or VSS2) connect using vias 220 at as many points as possible where the two overlap; and the horizontal trunks and vertical rails of the same type (i.e., VDD2 or VSS2) connect using vias 222 at as many points as possible where the two overlap. In the present embodiment, vertical trunks do not connect directly to vertical rails. However, other embodiments may include such connections.

As can be seen in FIG. 8, the power/ground rails form a fine power distribution network which can supply power to all of the cells (or electronic components) formed on the semiconductor layer of the die. However, to reduce voltage drop, particularly to points at the interior of the die, a coarse power distribution network is provided. In the above embodiment, the coarse power distribution network takes the form of a mesh of horizontal and vertical power and ground trunks which have equal widths and, for a particular layer, have a fixed pitch. This particular embodiment has a number of advantages.

First, utilizing a fixed trunk pitch will tend to evenly distribute unused resources on the metal layers across the die. Second, a fixed trunk width is utilized in anticipation of a more or less uniform current distribution across the die. Moreover, connecting the horizontal trunks to the vertical trunks and the horizontal trunks to the vertical rails at as many intersection points as possible generally will tend to help insure that the coarse power distribution network is used for a greater portion of the connections between the power/ground rings and the individual electronic components. Finally, utilizing five metal layers with the power mesh implemented on metal layers 4 and 5 often can simplify routing requirements with respect to megacells. As noted above, in conventional techniques an interior megacell typically requires external power/ground rings for obtaining power/ground and for routing rails around the megacell. In the foregoing embodiment, however, a megacell typically can be connected directly to a trunk on metal layer 4 or 5 using routing, if necessary, also on metal layer 4 and/or 5. Similarly, according to this embodiment of the invention, rails generally can be routed above megacells by going up to the power mesh vertical layer for that portion where the rail crosses the megacell.

However, it should be understood that the foregoing implementation, while preferred, is not required. Various other implementations will have different advantages which may be more desirable in certain applications, as will be appreciated by those skilled in the art.

Fabrication.

Upon completion of design, as described above, the integrated circuit can be fabricated using the masks generated in step 108 (shown in FIG. 4), but otherwise employing conventional fabrication techniques. During fabrication, the masks generated in step 108 are used to pattern a silicon wafer using a sequence of photolithographic steps. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

The above-mentioned "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation typically involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping generally is achieved with thermal diffusion (wafer is heated and exposed to the desired dopant) and ion implantation (dopant atoms are ionized, accelerated to high velocities and implanted into the wafer surface).

Design System Environment.

Generally, the methods described herein with respect to IC design will be practiced with a general purpose computer, either with a single processor or multiple processors. FIG. 9 is a block diagram of a general purpose computer system, representing one of many suitable computer platforms for implementing the methods described above. FIG. 9 shows a general purpose computer system 450 in accordance with the present invention. As shown in FIG. 9, computer system 450 includes a central processing unit (CPU) 452, read-only memory (ROM) 454, random access memory (RAM) 456, expansion RAM 458, input/output (I/O) circuitry 460, display assembly 462, input device 464, and expansion bus 466. Computer system 450 may also optionally include a mass storage unit 468 such as a disk drive unit or nonvolatile memory such as flash memory and a real-time clock 470.

CPU 452 is coupled to ROM 454 by a data bus 472, control bus 474, and address bus 476. ROM 454 contains the basic operating system for the computer system 450. CPU 452 is also connected to RAM 456 by busses 472,474, and 476. Expansion RAM 458 is optionally coupled to RAM 456 for use by CPU 452. CPU 452 is also coupled to the I/O circuitry 460 by data bus 472, control bus 474, and address bus 476 to permit data transfers with peripheral devices.

I/O circuitry 460 typically includes a number of latches, registers and direct memory access (DMA) controllers. The purpose of I/O circuitry 460 is to provide an interface between CPU 452 and such peripheral devices as display assembly 462, input device 464, and mass storage 468.

Display assembly 462 of computer system 450 is an output device coupled to I/O circuitry 460 by a data bus 478. Display assembly 462 receives data from I/O circuitry 460 via bus 478 and displays that data on a suitable screen.

The screen for display assembly 462 can be a device that uses a cathode-ray tube (CRT), liquid crystal display (LCD), or the like, of the types commercially available from a variety of manufacturers. Input device 464 can be a keyboard, a mouse, a stylus working in cooperation with a position-sensing display, or the like. The aforementioned input devices are available from a variety of vendors and are well known in the art.

Some type of mass storage 468 is generally considered desirable. However, mass storage 468 can be eliminated by providing a sufficient mount of RAM 456 and expansion RAM 458 to store user application programs and data. In that case, RAMs 456 and 458 can optionally be provided with a backup battery to prevent the loss of data even when computer system 450 is turned off. However, it is generally desirable to have some type of long term mass storage 468 such as a commercially available hard disk drive, nonvolatile memory such as flash memory, battery backed RAM, PC-data cards, or the like.

A removable storage read/write device 469 may be coupled to I/O circuitry 460 to read from and to write to a removable storage media 471. Removable storage media 471 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 450 by typing on a keyboard, manipulating a mouse or trackball, or "writing" on a tablet or on position-sensing screen of display assembly 462. CPU 452 then processes the data under control of an operating system and an application program, such as a program to perform steps of the inventive method described above, stored in ROM 454 and/or RAM 456. CPU 452 then typically produces data which is output to the display assembly 462 to produce appropriate images on its screen.

Expansion bus 466 is coupled to data bus 472, control bus 474, and address bus 476. Expansion bus 466 provides extra ports to couple devices such as network interface circuits, modems, display switches, microphones, speakers, etc. to CPU 452. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.
Conclusion.

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. § 112 ¶6.

What is claimed is:

1. A method for use in designing an integrated circuit die which includes a semiconductor layer, a primary metal layer, a horizontal metal layer and a vertical metal layer, said method comprising:

a component layout step of laying out electronic components on the semiconductor layer;

a network layout step of laying out, on the primary metal layer, a primary power distribution network for distributing power to the electronic components;

a mesh design step of designing a power mesh that includes horizontal power trunks on the horizontal metal layer and vertical power trunks on the vertical metal layer, by calculating a uniform trunk width for all of the horizontal power trunks and all of the vertical power trunks based on a desired maximum voltage drop for the electronic component layout generated in said component layout step; and a mesh layout step of laying out the horizontal power trunks on the horizontal metal layer and the vertical power trunks on the vertical metal layer using the uniform trunk width calculated in said mesh design step, so as to form the power mesh, and specifying an electrical connection between the power mesh and the primary power distribution network, wherein the uniform trunk width is also based on wirebond resistance and a number of bond pads.

2. A method according to claim 1, wherein the power mesh is designed to limit a worst case voltage drop to any electronic component on the semiconductor layer to a specified maximum voltage drop.

3. An integrated circuit die designed using the method recited in claim 1.

4. A method according to claim 1, wherein the uniform trunk width is also based on total current consumption.

5. A method according to claim 4, wherein the total current consumption is estimated based on a multiplication of: clock frequency, current per gate per Megahertz, and gate count.

6. A method according to claim 1, further comprising a step of connecting at least one cell directly to the power mesh without utilizing the primary power distribution network.

7. A method for use in designing an integrated circuit die which includes a semiconductor layer, a primary metal layer, a horizontal metal layer and a vertical metal layer, said method comprising:

a component layout step of laying out electronic components on the semiconductor layer;

a network layout step of laying out, on the primary metal layer, a primary power distribution network for distributing power to the electronic components;

a mesh design step of designing a power mesh that includes horizontal power trunks on the horizontal metal layer and vertical power trunks on the vertical metal layer, by calculating a uniform trunk width for all of the horizontal power trunks and all of the vertical power trunks based on a desired maximum voltage drop for the electronic component layout generated in said component layout step; and a mesh layout step of laying out the horizontal power trunks on the horizontal metal layer and the vertical power trunks on the vertical metal layer using the uniform trunk width calculated in said mesh design step, so as to form the power mesh, and specifying an electrical connection between the power mesh and the primary power distribution network, wherein the power mesh is designed to limit a worst case voltage drop to any electronic component on the semiconductor layer to a specified maximum voltage drop, and wherein a voltage drop across the primary power distribution network is disregarded when determining the worst case voltage drop.

8. Computer-executable process steps stored on a computer readable medium, said process steps for use in designing an integrated circuit die which includes a semiconductor layer, a primary metal layer, a horizontal metal layer and a vertical metal layer, said process steps comprising:
   a component layout step to lay out electronic components on the semiconductor layer;
   a network layout step of laying out, on the primary metal layer, a primary power distribution network for distributing power to the electronic components;
   a mesh design step to design a power mesh that includes horizontal power trunks on the horizontal metal layer and vertical power trunks on the vertical metal layer, by calculating a uniform trunk width for all of the horizontal power trunks and all of the vertical power trunks based on a desired maximum voltage drop for the electronic component layout generated in said component layout step; and
   a mesh layout step to lay out the horizontal power trunks on the horizontal metal layer and the vertical power trunks on the vertical metal layer using the uniform trunk width calculated in said mesh design step, so as to form the power mesh, and to specify an electrical connection between the power mesh and the primary power distribution network,
   wherein the uniform trunk width is also based on wirebond resistance and a number of bond pads.

9. Computer-executable process steps according to claim 8, wherein the uniform trunk width is also based on total current consumption.

10. Computer-executable process steps according to claim 9, wherein the total current consumption is estimated based on a multiplication of: clock frequency, current per gate per Megahertz, and gate count.

11. Computer-executable process steps according to claim 8, further comprising a step to connect at least one cell directly to the power mesh without utilizing the primary power distribution network.

12. An apparatus for use in designing an integrated circuit die which includes a semiconductor layer, a primary metal layer, a horizontal metal layer and a vertical metal layer, said apparatus comprising:
   component layout means for laying out electronic components on the semiconductor layer;
   network layout means for laying out, on the primary metal layer, a primary power distribution network for distributing power to the electronic components;
   mesh design means for designing a power mesh that includes horizontal power trunks on the horizontal metal layer and vertical power trunks on the vertical metal layer, by calculating a uniform trunk width for all of the horizontal power trunks and all of the vertical power trunks based on a desired maximum voltage drop for the electronic component layout generated by said component layout means; and
   mesh layout means for laying out the horizontal power trunks on the horizontal metal layer and the vertical power trunks on the vertical metal layer using the uniform trunk width calculated by said mesh design means, so as to form the power mesh, and for specifying an electrical connection between the power mesh and the primary power distribution network,
   wherein the uniform trunk width is also based on wirebond resistance and a number of bond pads.

13. An apparatus according to claim 12, wherein the uniform trunk width is also based on total current consumption.

14. An apparatus according to claim 12, wherein the total current consumption is estimated based on a multiplication of: clock frequency, current per gate per Megahertz, and gate court.

15. An apparatus according to claim 12, further comprising means for connecting at least one cell directly to the power mesh without utilizing the primary power distribution network.

16. A method for use in designing an integrated circuit die which includes a semiconductor layer, a primary metal layer, a horizontal metal layer and a vertical metal layer, said method comprising:
   a component layout step of laying out electronic components on the semiconductor layer;
   a network layout step of laying out, on the primary metal layer, a primary power distribution network for distributing power to the electronic components;
   a mesh design step of designing a power mesh that includes horizontal power trunks on the horizontal metal layer and vertical power trunks on the vertical metal layer, by calculating a uniform trunk width for all of the horizontal power trunks and all of the vertical power trunks based on a desired maximum voltage drop for the electronic component layout generated in said component layout step; and
   a mesh layout step of laying out the horizontal power trunks on the horizontal metal layer and the vertical power trunks on the vertical metal layer using the uniform trunk width calculated in said mesh design step, so as to form the power mesh, and specifying an electrical connection between the power mesh and the primary power distribution network,
   wherein the uniform trunk width is calculated as follows:

$$W_{trunk} = \frac{\rho_{unit} \times L \times K_D \times I_{total}}{T\left(\frac{1}{2} V_{desdrop} - \left(\frac{I_{total}}{4N} \times R_{wb} + \frac{1}{4} \times I_{avg} \times R_{seg}\right)\right)},$$

wherein $W_{trunk}$ is the uniform trunk width.

17. Computer-executable process steps stored on a computer readable medium, said process steps for use in designing an integrated circuit die which includes a semiconductor layer, a primary metal layer, a horizontal metal layer and a vertical metal layer, said process steps comprising:
   a component layout step to lay out electronic components on the semiconductor layer;
   a network layout step of laying out, on the primary metal layer, a primary power distribution network for distributing power to the electronic components;
   a mesh design step to design a power mesh that includes horizontal power trunks on the horizontal metal layer and vertical power trunks on the vertical metal layer, by calculating a uniform trunk width for all of the horizontal power trunks and all of the vertical power trunks based on a desired maximum voltage drop for the electronic component layout generated in said component layout step; and
   a mesh layout step to lay out the horizontal power trunks on the horizontal metal layer and the vertical power trunks on the vertical metal layer using the uniform trunk width calculated in said mesh design step, so as to form the power mesh, and to specify an electrical connection between the power mesh and the primary power distribution network,
   wherein the uniform trunk width is calculated as follows:

$$W_{trunk} = \frac{\rho_{unit} \times L \times K_D \times I_{total}}{T\left(\frac{1}{2}V_{desdrop} - \left(\frac{I_{total}}{4N} \times R_{wb} + \frac{1}{4} \times I_{avg} \times R_{seg}\right)\right)},$$

wherein $W_{trunk}$ is the uniform trunk width.

18. An apparatus for use in designing an integrated circuit die which includes a semiconductor layer, a primary metal layer, a horizontal metal layer and a vertical metal layer, said apparatus comprising:

component layout means for laying out electronic components on the semiconductor layer;

network layout means for laying out, on the primary metal layer, a primary power distribution network for distributing power to the electronic components;

mesh design means for designing a power mesh that includes horizontal power trunks on the horizontal metal layer and vertical power trunks on the vertical metal layer, by calculating a uniform trunk width for all of the horizontal power trunks and all of the vertical power trunks based on a desired maximum voltage drop for the electronic component layout generated by said component layout means; and mesh layout means for laying out the horizontal power trunks on the horizontal metal layer and the vertical power trunks on the vertical metal layer using the uniform trunk width calculated by said mesh design means, so as to form the power mesh, and for specifying electrical connection between the power mesh and the primary power distribution network, wherein the uniform trunk width is calculated as follows:

$$W_{trunk} = \frac{\rho_{unit} \times L \times K_D \times I_{total}}{T\left(\frac{1}{2}V_{desdrop} - \left(\frac{I_{total}}{4N} \times R_{wb} + \frac{1}{4} \times I_{avg} \times R_{seg}\right)\right)},$$

wherein $W_{trunk}$ is the uniform trunk width.

* * * * *